United States Patent
Doubler et al.

(10) Patent No.: US 6,938,197 B2
(45) Date of Patent: Aug. 30, 2005

(54) CRC CALCULATION SYSTEM AND METHOD FOR A PACKET ARRIVING ON AN N-BYTE WIDE BUS

(75) Inventors: James A. Doubler, Wheaton, IL (US); Michael P. Hammer, Westchester, IL (US); Shu C. Yuan, Naperville, IL (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 413 days.

(21) Appl. No.: 10/210,367

(22) Filed: Aug. 1, 2002

(65) Prior Publication Data

US 2004/0025105 A1 Feb. 5, 2004

(51) Int. Cl.$^7$ .................. H03M 13/00; G06F 11/10
(52) U.S. Cl. ................... 714/757; 714/807
(58) Field of Search .............. 714/752, 757–758, 714/807, 781

(56) References Cited

U.S. PATENT DOCUMENTS

| | | | | |
|---|---|---|---|---|
| 6,609,225 B1 | * | 8/2003 | Ng | 714/781 |
| 6,647,528 B1 | * | 11/2003 | Collette et al. | 714/758 |
| 6,732,317 B1 | * | 5/2004 | Lo | 714/757 |
| 6,732,318 B2 | * | 5/2004 | Collier et al. | 714/758 |

OTHER PUBLICATIONS

Altera Corporation; crc MegaCore Function—Parameterized CRC Generator/Checker; pp. 1–8; version 2; Apr. 1999.
Cypress Semiconductor Corporation; Parallel Cyclic Redundancy Check (CRC) for HOTLink™; pp. 1–4; Mar. 11, 1999.
Jack G. Ganssle; Avocet Systems, Inc.; Computing CRCs in Parallel; http://www.avocetsystems.com/company/articles/magazine/acrc.htm; 8 pages; 1991.

* cited by examiner

Primary Examiner—Shelly A Chase

(57) ABSTRACT

The present invention provides a cyclic redundancy check (CRC) calculation system for a packet arriving on an n-byte wide bus. In one embodiment, the system includes a bus-wide CRC subsystem configured to calculate an intermediate CRC value based on complete segments of the packet. In addition, the system includes a byte-wide CRC subsystem, coupled to the bus-wide subsystem, configured to calculate a remaining CRC value based on the intermediate CRC value and one or more bytes within an incomplete segment of the packet on a byte by byte basis. In addition, a method of calculating a CRC value for a packet arriving on a n-byte wide bus and a data transmission system incorporating the system are also disclosed.

21 Claims, 3 Drawing Sheets

CRC CALCULATION SYSTEM AND METHOD FOR A PACKET ARRIVING ON AN N-BYTE WIDE BUS

TECHNICAL FIELD OF THE INVENTION

The present invention is directed, in general, to cyclic redundancy check (CRC) calculation systems, and, more specifically, to a CRC calculation system for a packet arriving on an n-byte wide bus and a method of calculation.

BACKGROUND OF THE INVENTION

Data transmission across communications networks has continued to gain widespread use throughout the world. Typically, data is transmitted over communications networks by first partitioning a message or data into data packets according to network protocol. The data packets may then be transmitted across a communications network, each packet likely taking their own route to get to the desired location. After transmission, processing circuitry on the receiving end of the transmission reconstructs the data packets into the message or data originally transmitted.

To ensure the accuracy of the data transmitted across a network, and to detect transmission errors as soon as they occur, various techniques have been implemented over the years. Perhaps the most popular technique is to append Cyclic Redundancy Check (CRC) values to the data packets before they are transmitted across the network. As each data packet is received, a CRC calculation is performed on each data packet to produce a CRC value. This CRC value is compared to the CRC value appended to the data packet to determined if they are the same. If data has been lost or corrupted during transmission, the comparison of CRC values usually detects the error.

CRC processing logic is often implemented using a parallel architecture due to the high data transmission rates now being supported, as well as limitations on practical and cost effective processor cycle times. In such an architecture, CRC values are calculated over multiple data bits each clock cycle. Typically, conventional implementations are based on an internal databus having a given width (n×8 bits, where "n" is the number of bytes in the bus-width). Although data packets typically vary in length, data packet transmission standards usually set packet length variation on a given boundary, for example, on an 8-bit boundary. As a result, each incoming data packet is typically analyzed by viewing each data packet in segments, some having the full given bus-width of data, and the last segment possibly having only a byte-wide sub-multiple of the overall bus-width for the network.

In the commonly found parallel architecture CRC calculation systems, updated CRC values are calculated each clock cycle as a function of a CRC value calculated the previous clock cycle and data coming from the current segment. To calculate an intermediate CRC value for those segments of a data packet where all the bytes therein are present, a predetermined amount of logic is required based, in part, on the size of the boundary set by the network standard. Although the logic employed to calculate this intermediate CRC value is complex, based primarily on the size of the equations needed to calculate all of the bytes in the predetermined segment width, the logic does not vary since all of the available bytes of the segments processed with this logic are present.

Unfortunately, when the final CRC calculation is performed on the last segment, the logic required may become much more complex. Since any number of the maximum number of bytes in a final segment may or may not be present, logic capable of calculating each of the different possibilities is typically required. More specifically, the logic employed to calculate the remaining CRC value for the final segment must account for the relationship between the previously calculated CRC value and one, two, three, . . . n−1 bytes of an incomplete final segment in an n-byte wide bus. Those who are skilled in the art understand that conventional CRC calculation systems accounting for so many variable relationships would typically require large and complex logic circuitry within the chip or other structures within the communications device. This is the case because the equations used in such calculations become similarly large and complex as the number of possible relationships increase. In many cases, separate logic is needed for each possibility. For example, where a data packet is partitioned into n-byte segments for an n-byte wide bus, an incomplete final segment would require n−1 sets of different logic circuits just to calculate a CRC value for the final segment of a data packet.

Semiconductor manufacturers understand that as the amount of logic required increases, so also does the costs of manufacturing the device. In addition, greater surface area is taken as the complexity of the logic circuitry increases. Therefore, the downsizing of communications devices can become problematic, as does the use of limited logic devices, such as Field Programmable Gate Arrays (FPGAs) and Field Programmable System Chips (FPSCs) throughout communications networks.

Accordingly, what is needed in the art is an enhanced CRC calculation system for calculating a CRC value for data packets having partial data segments that does not suffer from the deficiencies found in conventional CRC calculation systems.

SUMMARY

To address the above-discussed deficiencies of the prior art, the present invention provides a cyclic redundancy check (CRC) calculation system for a packet arriving on an n-byte wide bus. In one embodiment, the system includes a bus-wide CRC subsystem configured to calculate an intermediate CRC value based on complete segments of the packet. In addition, the system includes a byte-wide CRC subsystem, coupled to the bus-wide subsystem, configured to calculate a remaining CRC value based on the intermediate CRC value and one or more bytes within an incomplete segment of the packet on a byte by byte basis.

In another aspect, the present invention provides a method of calculating a CRC value for a packet arriving on an n-byte wide bus. In one embodiment, the method includes calculating an intermediate CRC value based on complete segments of the packet. The method also includes calculating a remaining CRC value based on the intermediate CRC value and one or more bytes within an incomplete segment of the packet on a byte by byte basis.

In yet another aspect, the present invention provides a data transmission system. IN one embodiment, the system includes a communications network and a processor for partitioning data into a packet. In addition, the system includes a transmitter, coupled to the processor and the communications network, that transmits the packet across the communications network. The system also includes a receiver, coupled to the communications network, that receives the packet transmitted across the communications network. The system still further includes a CRC calculation system for the packet arriving on an n-byte wide bus, the CRC calculation system embodied in the transmitter to provide a transmission CRC value for transmission of the packet, or embodied in the receiver to provide a received CRC value for validation of the packet. In either embodiment, the CRC calculation system includes a bus-wide CRC subsystem that calculates an intermediate CRC value based on complete segments of the packet. In addition, the CRC calculation system includes a byte-wide CRC subsystem, coupled to the bus-wide subsystem, that calculates a remaining CRC value based on the intermediate CRC value and one or more bytes within an incomplete segment of the packet on a byte by byte basis, wherein the remaining CRC value is the transmission CRC value or the received CRC value.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
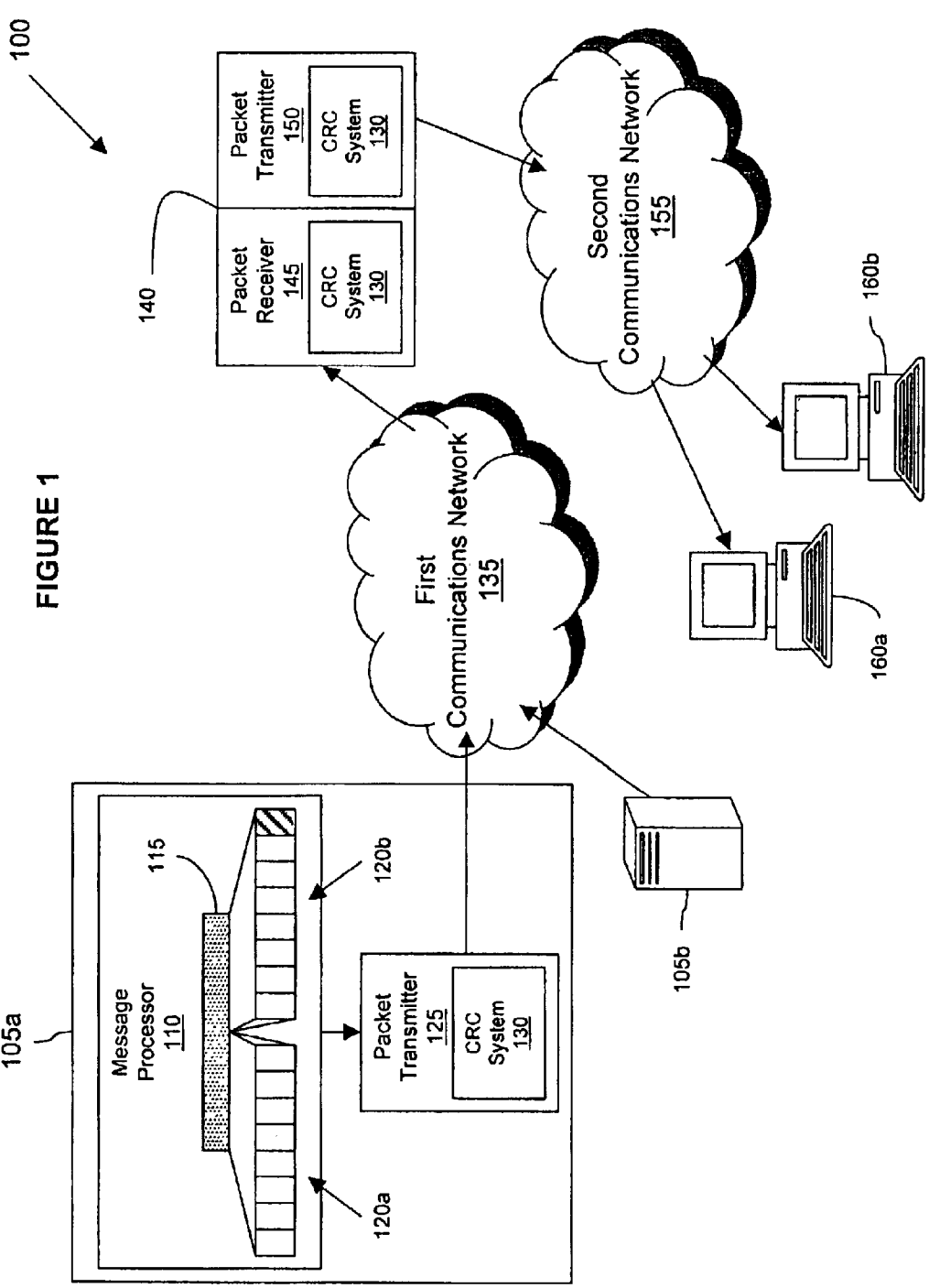
FIG. 1 illustrates one embodiment of a data transmission system, which may provide an environment for a cyclic redundancy check calculation system constructed according to the principles of the present invention.

Referring initially to FIG. 1, illustrated is one embodiment of a data transmission system 100, which may provide an environment for a cyclic redundancy check (CRC) calculation system constructed according to the principles of the present invention. As illustrated, the data transmission system 100 includes first and second servers 105*a*, 105*b*. As illustrated, the first server 105*a* includes a message processor 110. The message processor 110 receives data in the form of message 115 and, for data transmission, the message processor 110 partitions the message into a plurality of data packets (two of which are illustrated as data packets 120*a*, 120*b*). However, before the data packets 120*a*, 120*b* may be transmitted, they are analyzed so that a CRC value for each data packet 120*a*, 120*b* may be calculated. As illustrated, each data packet 120*a*, 120*b* include segments for this purpose.

The first data packet 120*a* includes a complete eight segments therein. However, the second data packet 120*b* includes only seven complete segments, and one incomplete segment (denoted by hatch marks in FIG. 1). For the purposes of the present invention, a "complete segment" of a data packet is a segment of a data packet sized to have a maximum number of data bytes equal to the bus-width of a communications device, wherein the maximum number of bytes are present in the segment. A communications device may be a conventional server, processor or any device used in the transmission and reception of data packets. For example, in a communications device having a 64-bit bus width, a data packet may be analyzed in 8-byte segments (64-bit bus width=8 bytes). If a 1024-bit data packet is analyzed, sixteen complete segments are present (1024 bits÷8 byte segment width=16 segments). Conversely, as used herein, an "incomplete segment" of a data packet is a segment of a data packet sized to have a maximum number of data bytes equal to the bus-width of the communications device, but the segment contains less than the maximum number of bytes for that segment. For instance, in the example above, if a 1016-bit data packet (127 bytes) is partitioned into 8-byte segments (for a 64-bit bus-width), only fifteen segments are complete (all 8 bytes of fifteen segments are present=120 bytes) and the sixteenth segment is incomplete (only having seven bytes of the available maximum of eight bytes in the segment). As discussed in detail above, calculating a CRC value for a data packet having an incomplete segment using conventional techniques typically requires large calculations and a large amount of logic with which to perform those calculations.

The data packets 120*a*, 120*b* are then passed to a packet transmitter 125, which may include a CRC calculation system 130 constructed according to the principles of the present invention. The CRC calculation system 130 calculates a CRC value for the first data packet 120*a* by analyzing the segments of packet 120*a*. Once a CRC value has been calculated, the CRC value is appended to the data packet 120*a* and transmitted across a first communications network 135. The CRC calculation system 130 then performs the same calculation for the next data packet 120*b*. In one embodiment, the first communications network 135 may be a Local Area Network (LAN), a Wide Area Network (WAN), or the Internet, however the present invention may be employed in any type of communications network capable of transmitting data packets. In addition, the communications network 135 may also employ Ethernet. As illustrated, the data transmission system 100 may also include the CRC calculation system 130 in the second server 105*b*, or any number of other devices capable of processing and transmitted data across a communications network.

After transmission through the first communications network 135, the data packets 120*a*, 120*b* may be downloaded to a bridge 140 by a packet receiver 145. As shown, the receiver 145 may include a CRC calculation system 130 of the present invention for individually validating the CRC values appended to each of the data packets 120*a*, 120*b*. The bridge 140 also includes a second packet transmitter 150 for transmitting the data packets 120*a*, 120*b* through a second communications network 155. As such, the bridge 140 may alternatively be a router, a PC network card or a switch. As with the first packet transmitter 125, the second packet transmitter 150 may also include a CRC calculation system 130 of the present invention. The data packets 120*a*, 120*b* may then be downloaded to first and second workstations 160*a*, 160*b* for use by end users. If desired, the workstations 160*a*, 160*b* may also include a CRC calculation system 130 for another accuracy check of the data packets 120a, 120b after transmission across the second communications network 155.

Figure 2:
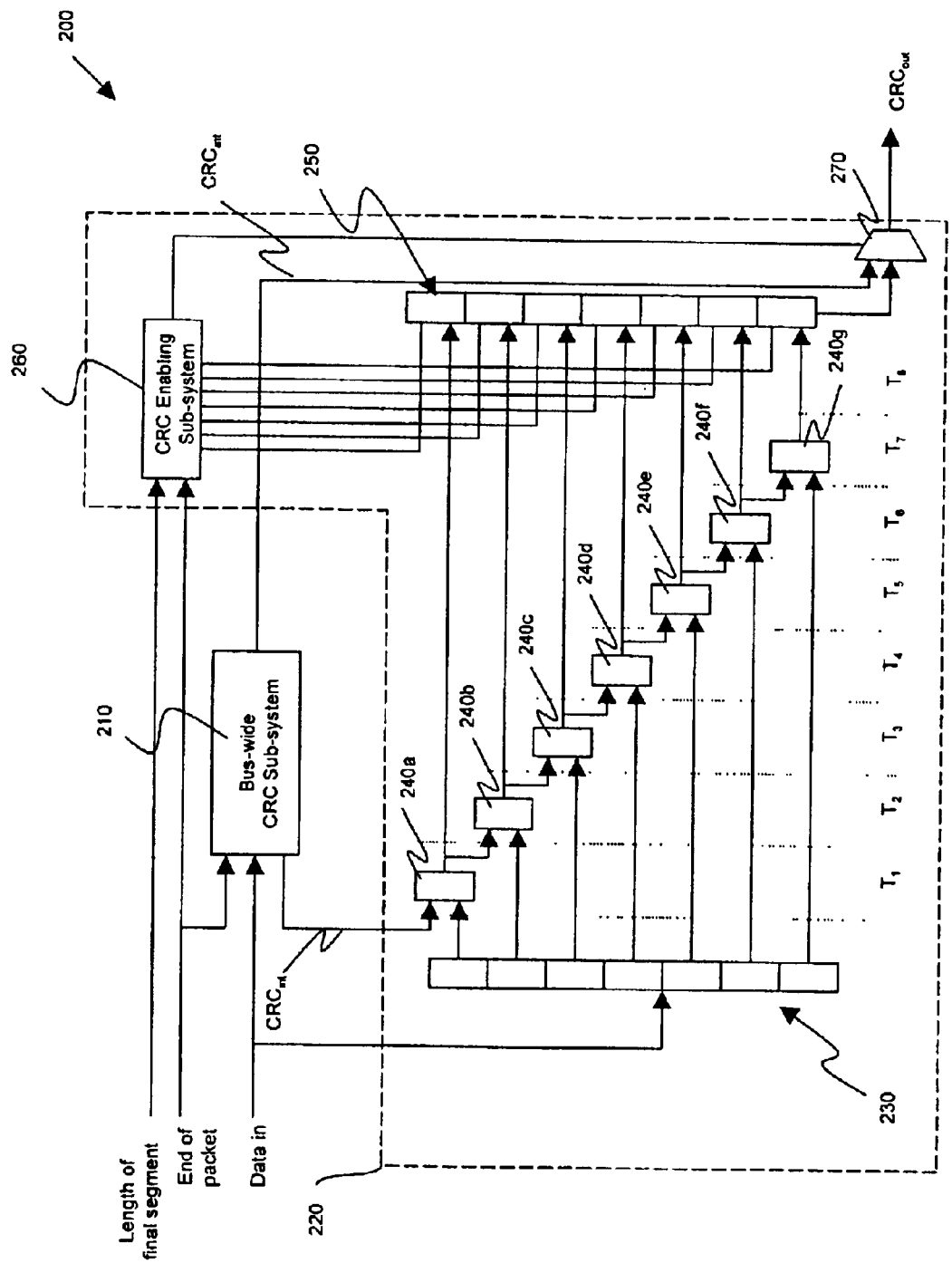
FIG. 2 illustrates one embodiment of a CRC calculation system constructed according to the principles of the present invention.

Looking now at FIG. 2, illustrated is one embodiment of a CRC calculation system 200 constructed according to the principles of the present invention. The CRC calculation system 200 illustrated in FIG. 2 may be embodied in a number of communications devices for use with data transmission networks, all in accordance with the principles of the present invention disclosed herein. Examples include, but are not limited to, programmable logic devices (PDAs), FPGAs and FPSCs.

The CRC calculation system 200 includes a bus-wide CRC subsystem 210, which includes circuitry configured to calculate an intermediate CRC value for all complete segments of data packets that are to be transmitted through a communications network. All segments of a data packet on which a CRC calculation, according to the principles of the present invention, is to be performed are passed into the CRC calculating system 200 through a "Data in" input. More specifically, the complete segments of the data packets to be transmitted (or that have been received) are sent into the bus-wide CRC subsystem 210 for CRC value calculation thereon. The bus-wide CRC subsystem 210 includes logic therein for calculating a CRC value on only the complete segments of a data packet, typically employing conventional equations and techniques for such a CRC calculation. However, rather than performing a CRC value calculation on all the complete segments and any incomplete segment of a data packet, the bus-wide CRC subsystem 210 only calculates a CRC value for the complete segments, e.g., an intermediate CRC value $CRC_{int}$, which is fed into a byte-wide CRC subsystem 220. In addition, any incomplete segment, if present, is input into the byte-wide CRC subsystem 220 via the same "Data in" input used to input the complete segments into the bus-wide CRC subsystem 210.

In an advantageous embodiment of the present invention, the byte-wide CRC subsystem 220 includes an input holding register 230 for holding the individual bytes of an incomplete segment to be processed by the byte-wide CRC subsystem 220. As illustrated, in an embodiment where the predetermined size of a data packet segment is eight bytes (for instance, in a 64-bit bus-width network), the input holding register 230 may include seven latches. In this embodiment, each latch of the input holding register 230 would accommodate one byte of an incomplete segment, such that up to seven bytes of the eight byte maximum segment size for a 64-bit bus-width may be written therein. Of course, the number of latches and the size of the input holding register 230 may vary based on the bus-width of the network involved. For example, the input holding register 230 will have n−1 latches for an n-byte wide bus.

The byte-wide CRC subsystem 220 also includes a plurality of cascading byte-wide CRC sub-circuits 240a–240g, each corresponding to a latch of the input holding register 230. In the illustrated 64-bit bus-width embodiment, first 240a through seventh 240g byte-wide sub-circuits are shown, since the maximum number of one-byte portions of an incomplete segment is seven (eight one-byte portions would make a complete segment, which would be processed through the bus-wide CRC subsystem 210). In must be understood, however, that the number of byte-wide CRC sub-circuits 240a–240g will vary depending on the bus-width of the communications network in which the CRC calculating system 200 of the present invention is to be employed. In the illustrated embodiment, the number of byte-wide CRC sub-circuits is n−1 for an n-byte wide bus.

For example, if a 128-bit bus-width network is used and the segments of a data packet are a maximum of sixteen bytes, rather than eight bytes. Then, the byte-wide CRC subsystem 220 would include fifteen byte-wide CRC sub-circuits, each one corresponding to one of the fifteen maximum bytes for an incomplete segment. Thus, although only a CRC calculation system 200 for use with a 64-bit bus-width network is shown, the present invention is broad enough for use with any size bus-width network, without departing from the scope of the invention.

The byte-wide CRC subsystem 220, via updates from each of the byte-wide CRC sub-circuits 240a–240g, is configured to calculate a remaining CRC value based on the intermediate CRC value $CRC_{int}$ and any incomplete segment of the data packet. More specifically, during a first byte-cycle T1, the intermediate CRC value $CRC_{int}$ calculated by the bus-wide CRC subsystem 210 is passed to the first byte-wide CRC sub-circuit 240a, along with the first byte of the incomplete segment. For the purposes of the present invention, a "byte-cycle" is the time required to calculate a CRC value for one byte of a segment of a data packet. In the illustrated embodiment, the first byte is provided from the first latch of the input holding register 230. The first byte-wide CRC sub-circuit 240a then processes these two inputs and performs a byte-wide (8 bit) CRC calculation thereon to provide an initial update to the remaining CRC value. If the incomplete segment includes only one byte, the initial update to the remaining CRC value calculated by the first byte-wide CRC sub-circuit 240a is written into a first latch in an output pipeline register 250 of the byte-wide CRC subsystem 220. In accordance with the principles of the present invention, the output pipeline register 250 includes n−1 latches for an n-byte wide bus, and is configured to sequence each of the n−1 latches to provide subsequent updates to the remaining CRC value. In the illustrated embodiment, the output pipeline register 250 includes 7 latches because only an 8-byte bus width is present. It must be noted, however, that the present invention is not limited to any particular number of latches.

To enable the remaining CRC value to be so written into the output pipeline register 250, a CRC enabling subsystem 260 is coupled to the output pipeline register 250. The CRC enabling subsystem 260 is activated by an "End of packet" control signal that informs the CRC enabling subsystem 260 that the last segment, which may be incomplete, has arrived in the system 200. In addition, the CRC enabling subsystem 260 controls whether the value output from the first byte-wide CRC sub-circuit 240a is only an update for the remaining CRC value, or comprises the entire remaining CRC value, using a "Length of final segment" input. Specifically, the "Length of final segment" input informs the CRC enabling subsystem 260 how many of the available bytes (eight bytes in a 64-bit bus-width device) of the incomplete segment contain data.

For example, if only one byte in the incomplete segment contains data, the Length of final segment input informs the CRC enabling subsystem 260 of that fact such that only the first byte-wide CRC sub-circuit 240a is needed to calculate an updated remaining CRC value, based on the intermediate CRC value $CRC_{int}$. That CRC value may then be written into the first latch of the output pipeline register 250. Thus, if the incomplete segment only includes the first byte, the remaining bytes of the incomplete segment would contain garbage data, some type of filler or may even be empty. In this case, the value calculated by the first byte-wide CRC sub-circuit 240a would comprise the entire remaining CRC value.

In addition, the Length of final segment input also informs the CRC enabling subsystem 260 that only one byte in the incomplete segment contains data. The CRC enabling subsystem 260 would thus enable the updated remaining CRC value to be written into the first latch of the output pipeline register 250. As a result, the CRC enabling subsystem 260 allows the updated remaining CRC value calculated by the first byte-wide CRC sub-circuit 240a to sequence through the output pipeline register 250, one latch per byte-cycle. Moreover, while the writing of the remaining CRC value calculated by the first byte-wide CRC sub-circuit 240a into the first latch of the output pipeline register 250 occurred during the first byte-cycle T1, during the next seven byte-cycles T2–T8 the CRC enabling subsystem 260 prevents the remaining CRC value from being overwritten while sequencing through the other latches of the output pipeline register 250. After sequencing, the remaining CRC value from the first byte-wide CRC sub-circuit 240a exits the output pipeline register 250 as the final CRC value $CRC_{out}$.

However, in an embodiment where the incomplete segment includes, for example, seven of the eight bytes of the segment, the output from the first byte-wide CRC sub-circuit 240a would not become the final CRC value $CRC_{out}$. Instead, during the second byte-cycle T2, the remaining CRC value from the first byte-wide CRC sub-circuit 240a would only be a first update for the remaining CRC value and would be fed into the second byte-wide CRC sub-circuit 240b, along with data from the second byte of the incomplete segment. The second byte-wide CRC sub-circuit 240b, which in a preferred embodiment of the present invention is substantially similar to the first byte-wide CRC sub-circuit 240a, would process and perform another one byte (8 bit) CRC calculation to generate a second update to the remaining CRC value. The "Length of final segment" input would then inform the CRC enabling subsystem 260 that the second byte in the incomplete segment is not the last byte in the segment. As a result, the CRC enabling subsystem 260 would prevent the output from the second byte-wide CRC sub-circuit 240b from being written into the second latch of the output pipeline register 250 as the entire remaining CRC value. Alternatively, the CRC enabling subsystem 260 may allow the CRC value calculated by the second byte-wide CRC sub-circuit 240b to be written in the second latch of the output pipeline register 250, but then be overwritten when the complete remaining CRC value has been calculated from one of the later cascading CRC sub-circuits 240c–240g. In either embodiment, the output from the second byte-wide CRC sub-circuit 240b would be a second update to the remaining CRC value.

The output from the second byte-wide CRC sub-circuit 240b would then be passed to the third byte-wide CRC sub-circuit 240c during the third byte-cycle T3, along with the third byte of data contained in a third latch of the input holding register 230. The third byte-wide CRC sub-circuit 240c would then provide a third update to the remaining CRC value, which would then be passed to the fourth byte-wide CRC sub-circuit 240d during the fourth byte-cycle T4, along with the fourth byte of data contained in a fourth latch of the input holding register 230. During the fifth byte-cycle T5, the update from the fourth byte-wide CRC sub-circuit 240d would be passed to the fifth byte-wide CRC sub-circuit 240e, along with the fifth byte of data contained in a fifth latch of the input holding register 230. During the sixth byte-cycle T6, the update from the fifth byte-wide CRC sub-circuit 240e would be passed to the sixth byte-wide CRC sub-circuit 240f, along with the sixth byte of data contained in a sixth latch of the input holding register 230. During the seventh byte-cycle T7, the update calculated by the sixth byte-wide CRC sub-circuit 240f would then be passed to the seventh byte-wide CRC sub-circuit 240g, along with the seventh byte of data contained in a seventh latch of the input holding register 230.

Finally, since the update calculated by the seventh byte-wide CRC sub-circuit 240g is based on the last byte of the incomplete segment (in this 64-bit bus-width example), the CRC enabling subsystem 260 would enable the remaining CRC value calculated by the seventh byte-wide CRC sub-circuit 240g to be written into the seventh latch of the output pipeline register 250. Then, during the eighth byte-cycle T8, the updated remaining CRC value from the seventh byte-wide CRC sub-circuit 240g would be sequenced out of the output pipeline register 250 as the final CRC value $CRC_{out}$. Again, it should be noted that although only seven cascading byte-wide CRC sub-circuits 240a–240g are illustrated, the present invention is broad enough to encompass any number of byte-wide CRC sub-circuits, in accordance with the principles described herein, and may vary based on the bus-width of the network employed.

In addition, if an incomplete segment having only three bytes containing data, for example, were present, only the first three CRC sub-circuits 240a–240c would be employed to provide the final CRC value $CRC_{out}$. In such an embodiment, the CRC enabling subsystem 260 would allow the updated remaining CRC value calculated by the third CRC sub-circuit 240c to be written into the third latch of the output pipeline register 250, and enable that value to sequence through the remaining latches of the output pipeline register 250 without being overwritten until it is sequenced out as final CRC value $CRC_{out}$. A similar situation would result if any other number of bytes in an incomplete segment contained data.

Also in the illustrated embodiment is an optional multiplexer 270. In such an embodiment, the multiplexer 270 may be configured to cause the intermediate CRC value $CRC_{int}$ to become the final CRC value $CRC_{out}$ if it is determined that the final segment in the data packet is not an incomplete segment. More specifically, the intermediate CRC value $CRC_{int}$ output from the bus-wide CRC sub-system 210 is passed to the multiplexer 270, as well as the first byte-wide CRC sub-circuit 240a during the first byte-cycle T1. If the "Length of final segment" input informs the CRC enabling subsystem 260 that the final segment of the data packet is in fact complete (e.g., all bytes are present), the CRC enabling subsystem 260 will enable the multiplexer 270 to receive the intermediate CRC value $CRC_{int}$ from the bus-wide CRC subsystem 210, and output it as the final CRC value $CRC_{out}$. This signifies that only complete segments of a data packet were present and, thus, the bus-wide CRC subsystem 210 has already performed the needed CRC calculations. Of course, the multiplexer 270 is not required to practice the present invention, and a byte-wide CRC subsystem 220 having eight byte-wide CRC sub-circuits may be employed to simply step through the CRC calculations for each byte in a complete final segment until the final CRC value $CRC_{out}$ is calculated.

Although a full eight byte-cycles are used to generate the final CRC value $CRC_{out}$, whether the final segment contains one or up to seven bytes, a CRC calculating system according to the present invention still provides substantial efficiency. While circuits found in the prior art that are devoted to calculating a remaining CRC value for an incomplete segment may be capable of doing so in less than eight byte-cycles, the amount of logic required to calculate the complex equations associated with the variable number of bytes in the final segment occupies a significant portion of overall circuit area. This is the case, as stated above, because separate logic is typically constructed for the possibility of whether one, two, three, four, five, six or seven bytes of data are present in an incomplete segment (in a 64-bit embodiment), with each circuit larger and more complex as the number increases. Furthermore, the number of circuits, and their complexity, further increases as the bus-width of the network increases.

Rather than requiring a multitude of complex logic, occupying a significant amount of overall area, the present invention provides for a plurality of relatively simplified 1-byte sub-circuits that calculate a corresponding update for the final CRC value each byte-cycle. If one or more bytes are present in an incomplete segment, the plurality of cascading sub-circuits calculates a remaining CRC value based on an intermediate CRC value calculated for the complete segments of the data packet and provides the final CRC value. In either situation, less complex logic circuits need to be constructed when employing a CRC calculating system according to the present invention. Those skilled in the art will understand that reducing the complexity of the logic constructed on a device directly reduces the associated manufacturing costs. This is the case not only because less complex logic requires less manufacturing time and resources to construct, but also because of a reduction in overall surface area occupied by the logic.

In practical terms, employing a system according to the present invention in the CRC calculation circuitry of a 64-bit bus-width communications device, when an incomplete segment is present, results in substantially less logic than is required in conventional 64-bit CRC calculation systems. In addition, as the bus width of conventional devices employing CRC systems increases, the amount of logic required for the increased number of combinations increases exponentially. Therefore, by decreasing the amount of logic required to calculate CRC values, a system according to the present invention provides even further advantage as bus-width increases. In short, as bus-width continues to increase to meet the demand for faster processing and transmission capability, the benefits in logic reduction provided by the present invention increase progressively.

Moreover, a network standard exists as to the spacing between the start of the segments comprising multiple data packets. Those skilled in the pertinent art understand that for a given network standard, such as Ethernet, a packet may only be transmitted on, for instance, a 64-bit boundary. For example, if a packet has an incomplete segment containing only two bytes, then any device wanting to transmit another packet must delay until the next 64-bit boundary. In this example, since the last segment contains only two bytes, a subsequent packet is delayed for the time it would take to transmit six additional bytes. As a result of such standards, a CRC calculation system according to the present invention may be implemented without a concern that an incomplete segment may appear before the final segment.

Without a standard spacing or packet boundary, collision between data packets would be rampant due to the variation in the number of bytes commonly found in the final segments of data packets. The present invention takes advantage of this interpacket delay, or "interframe gap," when processing any incomplete segments of data packets due to the fact that only the final segment may be an incomplete segment. Therefore, by simplifying the CRC calculations on a byte-by-byte basis for an incomplete segment, as well as spreading out the calculation time over the standard number of byte-cycles, the present invention provides for a CRC calculation system requiring far less complex logic, and occupies far less surface area, than conventional CRC calculation systems, while not detrimentally affecting the overall system throughput or performance.

Figure 3:
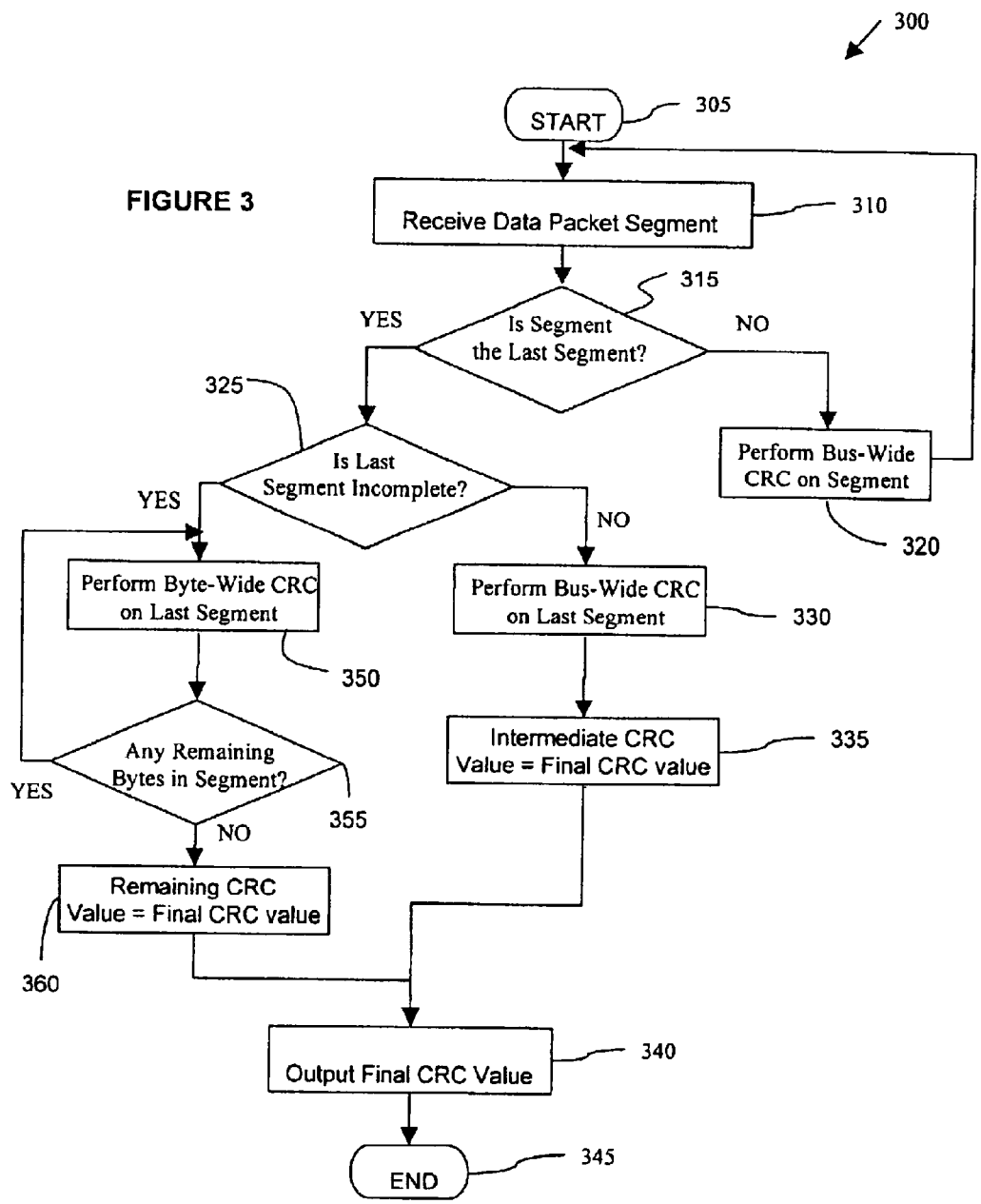
FIG. 3 illustrates a flow diagram of one embodiment of a method of calculating a CRC value for a data packet performed according to the principles of the present invention.

Turning finally to FIG. 3, illustrated is a flow diagram, generally designated 300, of one embodiment of a method of calculating a CRC value for a data packet, performed according to the principles of the present invention. The method of flow diagram 300 may be used to generate a CRC value for appending to a data packet or for validating an existing CRC value found therein. The method begins at a start step 305, where any initialization required is performed.

At a step 310, a segment of a data packet is received over an n-byte wide bus. As mentioned above, the size of the segments varies depending on the bus-width of the communications device employed. At a step 315, it is determined whether the current segment received is the last segment of the data packet. If the segment is not the last segment, the method advances to a step 320, where a bus-wide CRC calculation is performed on the segment. A bus-wide CRC calculation is performed since, in accordance with the segment boundaries discussed above, the size of all the non-final segments should be equivalent to the bus-width of the device. Stated another way, where a device bus has an n-byte bus-width, each non-final segment has an n-byte total width and each byte containing data therein. Once the bus-wide CRC calculation is performed on the non-final segment, the method returns to step 310, where another segment is received for CRC calculation or validation.

If it is determined that the segment received is the last segment, the method moves to a step 325, where it is determined whether the last segment is an incomplete segment. This determination may be made with reference to input signals or data headers, however the present invention is broad enough to encompass other means of determination. If the last segment is complete, the method moves to a step 330, where a bus-wide CRC calculation is performed on the last segment to produce an intermediate CRC value. Since the current segment is complete, the intermediate CRC value is set equal to the final CRC value for the data packet, at a step 335. The method then passes to a step 340, where the final CRC value just calculated is output and either appended to the data packet if the packet is being transmitted, or used to validate an existing CRC value if the packet is being received. The method then ends at an End step 345. The method would begin again at step 305 when segments from a new data packet are received.

If it is determined, at step 325, that the last segment is incomplete, the method moves to a step 350, where a byte-wide CRC calculation is performed on a first byte of the incomplete segment. Each byte-wide CRC calculation performed at step 350 is performed in accordance with the principles of the present invention discussed at length above. To perform the calculation, a first byte-wide CRC subcircuit calculates an initial remaining CRC value based on a bus-wide CRC calculation of the prior non-final complete segment, as well as the first byte of data of the incomplete segment. The method then moves to a step 355, where it is determined whether there are any remaining bytes in the incomplete segment containing data.

If there are other bytes containing data in the incomplete segment, the method returns to step 350, where another byte-wide CRC calculation occurs. More specifically, as the method returns to step 350, a second byte-wide CRC calculation would use the initial remaining CRC value calculated by the first CRC sub-circuit, and the second byte of data of the incomplete segment, to calculate an update to the remaining CRC value. Once this calculation using the second byte of data is completed, the method again passes to step 355, where it is again determined whether there are any remaining bytes in the incomplete segment containing data. If more bytes containing data remain, the method continues to return to step 350 to perform another byte-wide CRC calculation on the next byte containing data. In such an embodiment, cascading byte-wide CRC sub-circuits are used to perform sequential calculations on further bytes, with each calculation based on the prior update to the remaining CRC value by the prior byte-wide CRC sub-circuit and the next byte of data in the incomplete segment.

Once no more bytes containing data remain in the incomplete segment, the last update to the remaining CRC value is set equal to the final CRC value, at a step 360. For example, if the incomplete segment included four bytes of data, the update to the remaining CRC value calculated by a fourth byte-wide CRC sub-circuit would be set equal to the final CRC value. Once the last update to the remaining CRC value has been set equal to the final CRC value, at step 360, the final CRC value is output and either appended to, or used to validate, a data packet, at step 340. The method then ends at step 345, and, as mentioned above, begins again at step 305 when segments from a new data packet are received.

It must be noted that although only certain steps are illustrated in the method of FIG. 3, other embodiments of the invention may include a greater or lesser number of steps, without deviating from the broad scope of the present invention. It should also be noted that the steps described with reference to FIG. 3 are taken by appropriate circuitry configured to complete the desired task. For purposes of the present invention, the phrase "configured to" means that the device, the system, or the subsystem includes the necessary software, hardware, firmware, or a combination thereof, to accomplish the stated task.

Although the present invention has been described in detail, those skilled in the art should understand that they can make various changes, substitutions and alterations herein without departing from the spirit and scope of the invention in its broadest form.

What is claimed is:

1. A cyclic redundancy check (CRC) calculation system for a packet arriving on an n-byte wide bus, comprising:
   a bus-wide CRC subsystem configured to calculate an intermediate CRC value based on complete segments of said packet; and
   a byte-wide CRC subsystem, coupled to said bus-wide subsystem, configured to calculate a remaining CRC value based on said intermediate CRC value and one or more bytes within an incomplete segment of said packet on a byte by byte basis, wherein said byte-wide CRC subsystem includes a first byte-wide CRC sub-circuit configured to calculate a first update to said remaining CRC value from said intermediate CRC value and a first byte of said any incomplete segment.

2. The CRC calculation system as recited in claim 1 wherein said byte-wide CRC subsystem includes a multiplexer configured to cause said intermediate CRC value to be equal to said remaining CRC value when said packet lacks an incomplete segment.

3. The CRC calculation system as cited in claim 1 wherein said byte-wide CRC subsystem further includes a second byte-wide CRC sub-circuit configured to calculate a second update to said remaining CRC value from said first update to said remaining CRC value and a second byte of said any incomplete segment.

4. The CRC calculation system as recited in claim 1 wherein said byte-wide CRC subsystem includes:
   n−2 subsequent byte-wide CRC sub-circuits cascading from said first byte-wide CRC sub-circuit and configured to calculate subsequent updates to said remaining CRC value from said initial update and subsequent remaining bytes of said any incomplete segment.

5. The CRC calculation system as recited in claim 4 wherein said byte-wide CRC check subsystem includes an input holding register having n−1 latches, each of said latches configured to receive and hold a corresponding byte of said any incomplete segment for processing by a corresponding one of said byte-wide CRC sub-circuits.

6. The CRC calculation system as recited in claim 4 wherein said byte-wide CRC check subsystem further includes an output pipeline register having n−1 latches and configured to sequence each of said n−1 latches to provide said subsequent updates to said remaining CRC value.

7. The CRC calculation system as recited in claim 6 further including a CRC enabling subsystem coupled to said output pipeline register and configured to enable said subsequent updates to said remaining CRC value to be provided to said output pipeline register based upon a number of said remaining bytes.

8. A method of calculating a cyclic redundancy check (CRC) value for a packet arriving on an n-byte wide bus, comprising:
   calculating an intermediate CRC value based on complete segments of said packet; and
   calculating a remaining CRC value based on said intermediate CRC value and one or more bytes within an incomplete segment of said packet on a byte by byte basis, wherein said calculating said remaining CRC value further includes calculating a first update to said remaining CRC value from said intermediate CRC value and a first byte of said any incomplete segment.

9. The method as recited in claim 8 wherein said calculating of said remaining CRC value further includes causing said intermediate CRC value to be equal to said remaining CRC value when said packet lacks an incomplete segment.

10. The method as recited in claim 8 wherein said calculating said remaining CRC value further includes calculating a second update to said remaining CRC value from said first update to said remaining CRC value and a second byte of said any incomplete segment.

11. The method as recited in claim 8 wherein said calculating said remaining CRC value further includes:
    calculating an initial update to said remaining CRC value from said intermediate CRC value and a first byte of said any incomplete segment employing a first byte-wide CRC sub-circuit of said byte-wide CRC subsystem; and
    calculating subsequent updates to said remaining CRC value from said initial update and subsequent remaining bytes of said any incomplete segment employing n−2 subsequent byte-wide CRC sub-circuits of said byte-wide CRC subsystem cascading from said first byte-wide CRC sub-circuit.

12. The method as recited in claim 11 wherein said calculating said remaining CRC value further includes employing an input holding register having n−1 latches, each of said latches receiving and holding a corresponding byte of said any incomplete segment for processing by a corresponding one of said byte-wide CRC sub-circuits.

13. The method as recited in claim 11 wherein said calculating said remaining CRC value further includes employing an output pipeline register having n–1 latches and sequencing each of said n–1 latches to provide said subsequent updates to said remaining CRC value.

14. The method as recited in claim 13 wherein said calculating said remaining CRC value further includes employing a CRC enabling subsystem coupled to said output pipeline register and configured to enable said subsequent updates to said remaining CRC value to be provided to said output pipeline register based upon a number of said remaining bytes.

15. A data transmission system, comprising:

a communications network;

a processor for partitioning data into a packet;

a transmitter, coupled to said processor and said communications network, that transmits said packet across said communications network;

a receiver, coupled to said communications network, that receives said packet transmitted across said communications network; and a cyclic redundancy check (CRC) calculation system for said packet arriving on an n-byte wide bus, said CRC calculation system embodied in said transmitter to provide a transmission CRC value for transmission of said packet or embodied in said receiver to provide a received CRC value for validation of said packet, including:

a bus-wide CRC subsystem that calculates an intermediate CRC value based on complete segments of said packet; and a byte-wide CRC subsystem, coupled to said bus-wide subsystem, that calculates a remaining CRC value based on said intermediate CRC value and one or more bytes within an incomplete segment of said packet on a byte by byte basis, wherein said remaining CRC value is said transmission CRC value or said received CRC value, wherein said byte-wide CRC subsystem includes a multiplexer configured to cause said intermediate CRC value to be equal to said remaining CRC value when said packet lacks an incomplete segment.

16. The data transmission system as recited in claim 15 wherein said byte-wide CRC subsystem includes a first byte-wide CRC sub-circuit configured to calculate a first update to said remaining CRC value from said intermediate CRC value and a first byte of said any incomplete segment.

17. The data transmission system as recited in claim 16 wherein said byte-wide CRC subsystem further includes a second byte-wide CRC sub-circuit configured to calculate a second update to said remaining CRC value from said first update to said remaining CRC value and a second byte of said any incomplete segment.

18. The data transmission system as recited in claim 15 wherein said byte-wide CRC subsystem includes:

a first byte-wide CRC sub-circuit configured to calculate an initial update to said remaining CRC value from said intermediate CRC value and a first byte of said any incomplete segment; and n–2 subsequent byte-wide CRC sub-circuits cascading from said first byte-wide CRC sub-circuit and configured to calculate subsequent updates to said remaining CRC value from said initial update and subsequent remaining bytes of said any incomplete segment.

19. The data transmission system as recited in claim 18 wherein said byte-wide CRC check subsystem includes an input holding register having n–1 latches, each of said latches configured to receive and hold a corresponding byte of said any incomplete segment for processing by a corresponding one of said byte-wide CRC sub-circuits.

20. The data transmission system as recited in claim 18 wherein said byte-wide CRC check subsystem further includes an output pipelines register having n–1 latches and configured to sequence each of said n–1 latches to provide said subsequent updates to said remaining CRC value.

21. The data transmission system as recited in claim 20 further including a CRC enabling subsystem coupled to said output pipeline register and configured to enable said subsequent updates to said remaining CRC value to be provided to said output pipeline register based upon a number of said remaining bytes.

* * * * *

UNITED STATES PATENT AND TRADEMARK OFFICE
CERTIFICATE OF CORRECTION

PATENT NO.        : 6,938,197 B2
APPLICATION NO. : 10/210367
DATED              : August 30, 2005
INVENTOR(S)      : James A Doubler et al.

It is certified that error appears in the above-identified patent and that said Letters Patent is hereby corrected as shown below:

Col. 11, line 56: "said any incomplete segment" should read --said incomplete segment--.
Col. 12, line 37: "said any incomplete segment" should read --said incomplete segment--.

Signed and Sealed this

Seventh Day of August, 2007

JON W. DUDAS
*Director of the United States Patent and Trademark Office*